United States Patent
Suzuki et al.

(10) Patent No.: US 10,323,317 B2
(45) Date of Patent: Jun. 18, 2019

(54) GAS BARRIER LAMINATE, MEMBER FOR ELECTRONIC DEVICE, AND ELECTRONIC DEVICE

(71) Applicant: LINTEC CORPORATION, Tokyo (JP)

(72) Inventors: Yuuta Suzuki, Tokyo (JP); Wataru Iwaya, Tokyo (JP); Koichi Nagamoto, Tokyo (JP); Takeshi Kondo, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/780,817

(22) PCT Filed: Mar. 28, 2014

(86) PCT No.: PCT/JP2014/059326
§ 371 (c)(1),
(2) Date: Sep. 28, 2015

(87) PCT Pub. No.: WO2014/157685
PCT Pub. Date: Oct. 2, 2014

(65) Prior Publication Data
US 2016/0076133 A1 Mar. 17, 2016

(30) Foreign Application Priority Data
Mar. 29, 2013 (JP) .................. 2013-074081

(51) Int. Cl.
*C23C 14/06* (2006.01)
*H05K 5/06* (2006.01)
(Continued)

(52) U.S. Cl.
CPC .......... *C23C 14/0676* (2013.01); *B32B 7/00* (2013.01); *B32B 7/02* (2013.01); *B32B 7/10* (2013.01);
(Continued)

(58) Field of Classification Search
CPC ......... C23C 14/0676; B32B 7/00; B32B 7/02; B32B 7/10; B32B 9/00; B32B 9/04;
(Continued)

(56) References Cited

U.S. PATENT DOCUMENTS

| | | |
|---|---|---|
| 6,623,846 B2 | 9/2003 | Laird |
| 2006/0226517 A1 | 10/2006 | Iwanaga et al. |

(Continued)

FOREIGN PATENT DOCUMENTS

| | | |
|---|---|---|
| JP | 2004-351832 A | 12/2004 |
| JP | 2007-15350 A | 1/2007 |

(Continued)

OTHER PUBLICATIONS

English translation of Nakajima et al. (JP2009-196155), provided by espacenet, internet retrieval date of Mar. 23, 2016.*

(Continued)

*Primary Examiner* — Jonathan C Langman
(74) *Attorney, Agent, or Firm* — Birch, Stewart, Kolasch & Birch, LLP

(57) ABSTRACT

The present invention is a gas barrier laminate comprising a base and a gas barrier unit, the gas barrier unit comprising at least two inorganic layers, at least one of the at least two inorganic layers being a silicon oxynitride layer, the silicon oxynitride layer including a composition-gradient region that has a thickness of 25 nm or more, the composition-gradient region being a region in which a content ratio of oxygen decreases and a content ratio of nitrogen increases in a thickness direction toward the base, and a ratio of the thickness of the composition-gradient region to the thickness of the entire silicon oxynitride layer being 0.15 or more. The present invention also relates to: an electronic device member that includes the gas barrier laminate, and an electronic device that includes the electronic device member. The (Continued)

present invention provides: a gas barrier laminate that exhibits a very high gas barrier capability and very high bendability, an electronic device member that includes the gas barrier laminate, and an electronic device that includes the electronic device member.

14 Claims, 8 Drawing Sheets

(51) Int. Cl.
| | |
|---|---|
| *H05K 5/00* | (2006.01) |
| *B32B 9/00* | (2006.01) |
| *B32B 7/00* | (2019.01) |
| *B32B 7/02* | (2019.01) |
| *B32B 7/10* | (2006.01) |
| *B32B 9/04* | (2006.01) |
| *B32B 19/00* | (2006.01) |
| *B32B 19/04* | (2006.01) |
| *B32B 27/00* | (2006.01) |
| *B32B 27/06* | (2006.01) |
| *B32B 27/14* | (2006.01) |
| *B32B 27/16* | (2006.01) |
| *B32B 27/18* | (2006.01) |
| *B32B 27/28* | (2006.01) |
| *G02F 1/1333* | (2006.01) |

(52) U.S. Cl.
CPC ............ *B32B 9/00* (2013.01); *B32B 9/04* (2013.01); *B32B 19/00* (2013.01); *B32B 19/04* (2013.01); *B32B 27/00* (2013.01); *B32B 27/06* (2013.01); *B32B 27/14* (2013.01); *B32B 27/16* (2013.01); *B32B 27/18* (2013.01); *B32B 27/28* (2013.01); *H05K 5/0017* (2013.01); *H05K 5/069* (2013.01); *B32B 2250/00* (2013.01); *B32B 2264/00* (2013.01); *B32B 2264/10* (2013.01); *B32B 2264/102* (2013.01); *B32B 2264/104* (2013.01); *B32B 2307/546* (2013.01); *B32B 2307/7242* (2013.01); *B32B 2307/7244* (2013.01); *B32B 2307/7246* (2013.01); *B32B 2307/7248* (2013.01); *B32B 2307/732* (2013.01); *B32B 2457/00* (2013.01); *B32B 2457/20* (2013.01); *G02F 2001/133311* (2013.01)

(58) Field of Classification Search
CPC ......... B32B 19/00; B32B 19/04; B32B 27/00; B32B 27/06; B32B 27/14; B32B 27/16; B32B 27/18; B32B 27/28; B32B 2250/00; B32B 2264/00; B32B 2264/10; B32B 2264/102; B32B 2264/104; B32B 2307/546; B32B 2307/7242; B32B 2307/7244; B32B 2307/7246; B32B 2307/7248; B32B 2307/732; B32B 2457/00; B32B 2457/20; H05K 5/0017; H05K 5/069; G02F 2001/133311
See application file for complete search history.

(56) References Cited

U.S. PATENT DOCUMENTS

| | | |
|---|---|---|
| 2007/0026243 A1 | 2/2007 | Iwanaga et al. |
| 2013/0252002 A1 | 9/2013 | Suzuki |
| 2014/0154518 A1* | 6/2014 | Kikuchi ............... B05D 7/577 |
| | | 428/447 |
| 2014/0342149 A1* | 11/2014 | Naganawa ............ C23C 14/48 |
| | | 428/336 |

FOREIGN PATENT DOCUMENTS

| | | | | |
|---|---|---|---|---|
| JP | 4279816 | B2 | 6/2009 | |
| JP | 2009-196155 | * | 9/2009 | ............ B32B 27/00 |
| JP | 4425167 | B2 | 3/2010 | |
| JP | 2010-089397 | * | 4/2010 | ............ B32B 9/04 |
| JP | 2011-146226 | A | 7/2011 | |
| JP | 4717669 | B2 | 7/2011 | |
| JP | 2011-156752 | A | 8/2011 | |
| JP | WO2013069402 | * | 5/2013 | ............ B32B 9/00 |
| WO | WO 2012/067230 | A1 | 5/2012 | |

OTHER PUBLICATIONS

English translation of JP-2010-089397, provided by espace.net, internet retrival date Jan. 23, 2017.*
International Search Report, issued in PCT/JP2014/059326, dated Jun. 24, 2014.
Extended European Search Report dated Aug. 24, 2016 issued in European Patent Application No. 14776168.8.

* cited by examiner (a)

(b)

GAS BARRIER LAMINATE, MEMBER FOR ELECTRONIC DEVICE, AND ELECTRONIC DEVICE

TECHNICAL FIELD

The present invention relates to a gas barrier laminate, an electronic device member that includes the gas barrier laminate, and an electronic device that includes the electronic device member.

BACKGROUND ART

In recent years, attempts have been made to produce a flexible display (image display device) using a synthetic resin sheet instead of a glass substrate. However, since a synthetic resin sheet easily allows gas (e.g., water vapor) to pass through as compared with glass, and has poor surface flatness and the like, it was necessary to solve a number of problems in order to produce a flexible display using a synthetic resin sheet instead of a glass substrate.

Several gas barrier films in which a gas barrier inorganic compound thin film is stacked on a synthetic resin film have been proposed in order to solve this problem.

For example, Patent Document 1 discloses a transparent gas barrier laminate film that is obtained by sequentially stacking a silicon oxide layer having a high degree of oxidation (i.e., the value x of $SiO_x$ is 1.8 or more) and a silicon oxide layer having a low degree of oxidation (i.e., the value x of $SiO_x$ is 1.0 to 1.6) on one side or each side of a base formed of a plastic film, subjecting the surface of the silicon oxide layer having a low degree of oxidation to a plasma treatment using one gas or two or more gases among oxygen, nitrogen, argon, and helium, and stacking a polymer layer on the surface of the silicon oxide layer having a low degree of oxidation that has been subjected to the plasma treatment.

Patent Document 2 discloses a transparent gas barrier substrate in which a silicon oxynitride layer and a silicon nitride layer are sequentially stacked on one side or each side of a transparent resin substrate.

Patent Document 3 discloses a gas barrier film that includes at least a base film, and a gas barrier film that is provided on the base film and includes silicon, oxygen, and nitrogen, wherein the gas barrier film includes a region A in which the oxygen content is higher than the nitrogen content, a region B in which the nitrogen content is higher than the oxygen content, and a region C that is situated between the region A and the region B, the region C being a region in which the oxygen content gradually decreases from the region A and the nitrogen content gradually increases toward the region B.

Patent Document 4 discloses a gas barrier film that includes a unit that includes an SiN layer, an $SiO_xN_y$ layer, and an SiN layer.

Patent Document 5 discloses a gas barrier film that includes a transparent flexible support substrate 2, and at least one gas barrier layer 3a that includes a silicon oxynitride thin film A having a water vapor transmission rate of 0.09 $g/m^2/day$ or less, wherein the thin film A has an elemental composition in which N/Si (coefficient Xa) is 0.1 to 0.9, O/Si (coefficient Ya) is 0.65 to 1.85, and 4−(3Xa+2Ya) is 1 or less.

Patent Document 6 discloses a barrier film having a layer configuration in which at least an organic layer, a first inorganic layer, and a second inorganic layer are sequentially stacked on a resin substrate, wherein the first inorganic layer includes at least silicon oxide or silicon oxynitride, the second inorganic layer includes at least silicon oxynitride, and the concentration ratio (O+N)/O of the elements bonded to silicon included in the second inorganic layer is higher than that of the first inorganic layer.

Patent Document 7 discloses a gas barrier film in which a gas barrier unit that includes a gas barrier layer A, a gas barrier layer B, and a gas barrier layer C that are respectively formed of silicon oxide and/or silicon oxynitride is provided on at least one side of a resin substrate, wherein the gas barrier layer A, the gas barrier layer B, and the gas barrier layer C are provided sequentially from the resin substrate, the ratio (number of nitrogen atoms/number of oxygen atoms) of the number of nitrogen atoms to the number of oxygen atoms in silicon oxide and/or silicon oxynitride included in the gas barrier layer A is smaller than that of the gas barrier layer B, and the ratio (number of nitrogen atoms/number of oxygen atoms) of the number of nitrogen atoms to the number of oxygen atoms in silicon oxide and/or silicon oxynitride included in the gas barrier layer B is larger than that of the gas barrier layer C.

RELATED-ART DOCUMENT

Patent Document

Patent Document 1: JP-A-2004-351832
Patent Document 2: Japanese Patent No. 4279816
Patent Document 3: JP-A-2009-196155 (US2006226517A1)
Patent Document 4: Japanese Patent No. 4425167
Patent Document 5: Japanese Patent No. 4717669
Patent Document 6: JP-A-2011-146226
Patent Document 7: JP-A-2011-156752

SUMMARY OF THE INVENTION

Technical Problem

As described above, various gas barrier sheets in which a gas barrier inorganic compound thin film is stacked on a synthetic resin film have been proposed to date.

However, the gas barrier films disclosed in Patent Documents 1 to 7 do not exhibit a high gas barrier capability and high bendability that are required for an organic EL device sealing material and the like.

The invention was conceived in view of the above situation. An object of the invention is to provide a gas barrier laminate that exhibits a very high gas barrier capability and very high bendability, an electronic device member that includes the gas barrier laminate, and an electronic device that includes the electronic device member.

Solution to Problem

The inventors of the invention conducted extensive studies in order to solve the above problem. As a result, the inventors found that a very high gas barrier capability and very high bendability can be achieved by a gas barrier laminate that includes a base and a gas barrier unit, the gas barrier unit including at least two inorganic layers, at least one of the at least two inorganic layers being a silicon oxynitride layer, the silicon oxynitride layer including a composition-gradient region that has a thickness equal to or larger than a specific value, the composition-gradient region being a region in which the content ratio of oxygen decreases and the content ratio of nitrogen increases in the thickness direction toward the base, and the ratio of the thickness of the composition-gradient region to the thickness of the entire silicon oxynitride layer being equal to or larger than a specific value. This finding has led to the completion of the invention.

Several aspects of the invention provide the following gas barrier laminate (see (1) to (7)), electronic device member (see (8)), and electronic device (see (9)).

(1) A gas barrier laminate including a base and a gas barrier unit, the gas barrier unit including at least two inorganic layers, at least one of the at least two inorganic layers being a silicon oxynitride layer, the silicon oxynitride layer including a composition-gradient region that has a thickness of 25 nm or more, the composition-gradient region being a region in which the content ratio of oxygen decreases and the content ratio of nitrogen increases in the thickness direction toward the base, and the ratio of the thickness of the composition-gradient region to the thickness of the entire silicon oxynitride layer being 0.15 or more.

(2) The gas barrier laminate according to (1), wherein the difference between the maximum value and the minimum value of the content rate of oxygen atoms with respect to the total content of oxygen atoms, nitrogen atoms, and silicon atoms in the composition-gradient region included in the silicon oxynitride layer is 10 to 60%, and the difference between the maximum value and the minimum value of the content rate of nitrogen atoms with respect to the total content of oxygen atoms, nitrogen atoms, and silicon atoms in the composition-gradient region included in the silicon oxynitride layer is 5 to 30%.

(3) The gas barrier laminate according to (1), wherein the silicon oxynitride layer is formed by subjecting a layer that includes a polysilazane-based compound to an ion implantation treatment.

(4) The gas barrier laminate according to (3), wherein the ion implantation treatment implants ions of at least one gas selected from the group consisting of hydrogen, nitrogen, oxygen, argon, helium, neon, xenon, and krypton using a plasma ion implantation method.

(5) The gas barrier laminate according to (1), wherein the gas barrier unit has a layer configuration (i): inorganic layer/silicon oxynitride layer, a layer configuration (ii): silicon oxynitride layer/inorganic layer, a layer configuration (iii): inorganic layer/silicon oxynitride layer/silicon oxynitride layer, a layer configuration (iv): inorganic layer/inorganic layer/silicon oxynitride layer, or a layer configuration (v): inorganic layer/silicon oxynitride layer/inorganic layer/silicon oxynitride layer.

(6) The gas barrier laminate according to (1), wherein the silicon oxynitride layer is situated within the gas barrier unit at a position away from the base.

(7) The gas barrier laminate according to (1), wherein the silicon oxynitride layer includes the composition-gradient region at a position away from the base.

(8) An electronic device member including the gas barrier laminate according to any one of (1) to (7).

(9) An electronic device including the electronic device member according to (8).

Advantageous Effects of the Invention

The gas barrier laminate according to one aspect of the invention exhibits a very high gas barrier capability (water vapor transmission rate: on the order of $10^{-4}$ g/(m$^2$·day)), excellent interlayer adhesion, and excellent bendability.

DESCRIPTION OF EMBODIMENTS

Figure 1:
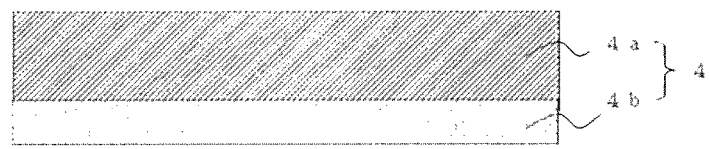
FIG. 1 is a cross-sectional view illustrating the layer configuration (structure) of a silicon oxynitride layer (4) included in a gas barrier laminate according to one embodiment of the invention.

A gas barrier laminate, an electronic device member, and an electronic device according to several exemplary embodiments of the invention are described in detail below.

1) Gas Barrier Laminate

A gas barrier laminate according to one embodiment of the invention includes a base and a gas barrier unit, the gas barrier unit including at least two inorganic layers, at least one of the at least two inorganic layers being a silicon oxynitride layer, the silicon oxynitride layer including a composition-gradient region that has a thickness of 25 nm or more, the composition-gradient region being a region in which the content ratio of oxygen decreases and the content ratio of nitrogen increases in the thickness direction toward the base, and the ratio of the thickness of the composition-gradient region to the thickness of the entire silicon oxynitride layer being 0.15 or more.

(1) Base

The base included in the gas barrier laminate according to one embodiment of the invention is not particularly limited as long as the base can support the gas barrier unit. A film-like or sheet-like material is normally used as the base.

The thickness of the base is not particularly limited, and may be appropriately determined taking account of the intended use of the gas barrier laminate. The thickness of the base is normally 0.5 to 500 μm, and preferably 1 to 100 μm.

A material for forming the base is not particularly limited as long as the material is suitable for the intended use of the gas barrier laminate according to one embodiment of the invention.

Examples of the material for forming the base include a resin (resin base) such as a polyimide, a polyamide, a polyamideimide, a polyphenylene ether, a polyether ketone, a polyether ether ketone, a polyolefin, a polyester, a polycarbonate, a polysulfone, a polyether sulfone, a polyphenylene sulfide, an acrylic-based resin, a cycloolefin-based polymer, and an aromatic polymer; paper (paper base) such as glassine paper, coated paper, and high-quality paper; laminated paper in which a resin is laminated on paper (paper base); and the like.

Among these, a resin (resin base) is preferable due to its excellent transparency and versatility. A polyester, a polyamide, a polysulfone, a polyether sulfone, a polyphenylene sulfide, and a cycloolefin-based polymer are more preferable, and a polyester and a cycloolefin-based polymer are still more preferable.

Examples of the polyester include polyethylene terephthalate, polybuthylene terephthalate, polyethylene naphthalate, polyarylate, and the like.

Examples of the polyamide include a wholly aromatic polyamide, nylon 6, nylon 66, a nylon copolymer, and the like.

Examples of the cycloolefin-based polymer include a norbornene-based polymer, a monocyclic cycloolefin-based polymer, a cyclic conjugated diene-based polymer, a vinyl alicyclic hydrocarbon-based polymer, and a hydrogenated product thereof. Specific examples of the cycloolefin-based polymer include APEL (ethylene-cycloolefin copolymer manufactured by Mitsui Chemicals Inc.), ARTON (norbornene-based polymer manufactured by JSR Corporation), ZEONOR (norbornene-based polymer manufactured by Zeon Corporation), and the like.

(2) Gas Barrier Unit

The gas barrier unit included in the gas barrier laminate according to one embodiment of the invention is characterized in that (a) the gas barrier unit includes at least two inorganic layers, at least one of the at least two inorganic layers being a silicon oxynitride layer, (b) the silicon oxynitride layer includes a composition-gradient region that has a thickness of 25 nm or more, the composition-gradient region being a region in which the content ratio of oxygen decreases and the content ratio of nitrogen increases in the thickness direction toward the base, and (c) the ratio of the thickness of the composition-gradient region to the thickness of the entire silicon oxynitride layer is 0.15 or more.

The inorganic layer and the silicon oxynitride layer included in the gas barrier unit function as a gas barrier layer that has a capability to suppress transmission of a gas (e.g., oxygen and water vapor) (i.e., gas barrier capability).

Inorganic Layer

Examples of the inorganic layer include an inorganic deposited film such as an inorganic compound deposited film and a metal deposited film; a layer that is obtained by subjecting a layer that includes a polymer compound (hereinafter may be referred to as "polymer layer") to a modification treatment (e.g., ion implantation treatment); and the like. In this case, the term "inorganic layer" does not refer to only the area modified by the modification treatment, but refers to the entire polymer layer that includes the area modified by the modification treatment. Specifically, when the inorganic layer is a layer that is obtained by subjecting the polymer layer to the modification treatment, the entire layer need not necessarily be formed only of an inorganic compound.

Examples of the raw material for forming the inorganic compound deposited film include an inorganic oxide such as silicon oxide, aluminum oxide, magnesium oxide, zinc oxide, indium oxide, and tin oxide; an inorganic nitride such as silicon nitride, aluminum nitride, and titanium nitride; an inorganic carbide; an inorganic sulfide; an inorganic oxynitride such as silicon oxynitride; an inorganic oxycarbide; an inorganic carbonitride; an inorganic oxycarbonitride; and the like.

These inorganic compounds may be used either alone or in combination.

Examples of the raw material for forming the metal deposited film include aluminum, magnesium, zinc, tin, and the like.

These metals may be used either alone or in combination.

An inorganic deposited film that is formed using an inorganic oxide, an inorganic nitride, or a metal as the raw material is preferable from the viewpoint of gas barrier capability. An inorganic deposited film that is formed using an inorganic oxide or an inorganic nitride as the raw material is preferable from the viewpoint of transparency.

The inorganic deposited film may be formed using a physical vapor deposition (PVD) method such as a vacuum deposition method, a sputtering method, or an ion plating method, or a chemical vapor deposition (CVD) method such as a thermal CVD method, a plasma CVD method, or a photo-CVD method, for example.

The thickness of the inorganic deposited film may be determined taking account of the type of the inorganic compound. The thickness of the inorganic deposited film is normally 5 nm or more, and preferably 10 nm or more, from the viewpoint of gas barrier capability. The thickness of the inorganic deposited film is normally 5,000 nm or less, preferably 500 nm or less, and more preferably 300 nm or less, from the viewpoint of suppressing the occurrence of cracks and the like. The inorganic deposited film may be formed by a single layer, or may be formed by two or more layers as long as the total thickness is within the above range. When the inorganic deposited film is formed by two or more layers, the two or more layers may be formed of an identical material, or may be formed of different materials.

Examples of the polymer compound used to form the polymer layer include a silicon-containing polymer compound (e.g., polyorganosiloxane and polysilazane-based compound), a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, a polyallylate, an acrylic-based resin, a cycloolefin-based polymer, an aromatic polymer, and the like.

These polymer compounds may be used either alone or in combination.

Among these, a silicon-containing polymer compound is preferable as the polymer compound since a barrier layer that exhibits an excellent gas barrier capability can be formed. Examples of the silicon-containing polymer compound include a polysilazane-based compound, a polycarbosilane-based compound, a polysilane-based compound, a polyorganosiloxane-based compound, and the like. Among these, a polysilazane-based compound is preferable since a barrier layer that exhibits an excellent gas barrier capability can be formed.

The polysilazane-based compound is a polymer compound that includes a repeating unit that includes an —Si—N— bond (silazane bond) in the molecule. The polysilazane-based compound is preferably a compound that includes a repeating unit represented by the following formula (1).

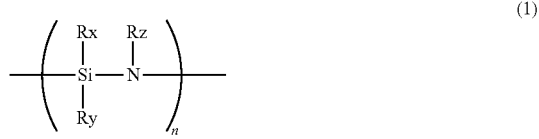

(1)

The number average molecular weight of the polysilazane-based compound is not particularly limited, but is preferably 100 to 50,000.

Note that n in the formula (1) is an arbitrary natural number.

Rx, Ry, and Rz are independently a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the alkyl group (that is substituted or unsubstituted) include an alkyl group having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the cycloalkyl group (that is substituted or unsubstituted) include a cycloalkyl group having 3 to 10 carbon atoms (e.g., cyclobutyl group, cyclopentyl group, cyclohexyl group, and cycloheptyl group).

Examples of the alkenyl group (that is substituted or unsubstituted) include an alkenyl group having 2 to 10 carbon atoms (e.g., vinyl group, 1-propenyl group, 2-propenyl group, 1-butenyl group, 2-butenyl group, and 3-butenyl group).

Examples of the substituent that may substitute the alkyl group, the cycloalkyl group, and the alkenyl group include a halogen atom such as a fluorine atom, a chlorine atom, a bromine atom, and an iodine atom; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the aryl group (that is substituted or unsubstituted) include an aryl group having 6 to 10 carbon atoms (e.g., phenyl group, 1-naphthyl group, and 2-naphthyl group).

Examples of the substituent that may substitute the aryl group include a halogen atom such as a fluorine atom, a chlorine atom, a bromine atom, and an iodine atom; an alkyl group having 1 to 6 carbon atoms, such as a methyl group and an ethyl group; an alkoxy group having 1 to 6 carbon atoms, such as a methoxy group and an ethoxy group; a nitro group; a cyano group; a hydroxyl group; a thiol group; an epoxy group; a glycidoxy group; a (meth)acryloyloxy group; a substituted or unsubstituted aryl group such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rx, Ry, and Rz. A hydrogen atom is particularly preferable as Rx, Ry, and Rz.

The polysilazane-based compound that includes the repeating unit represented by the formula (1) may be an inorganic polysilazane in which all of Rx, Ry, and Rz are hydrogen atoms, or an organic polysilazane in which at least one of Rx, Ry, and Rz is not a hydrogen atom.

A modified polysilazane may be used as the polysilazane-based compound. For example, the modified polysilazane disclosed in JP-A-62-195024, JP-A-2-84437, JP-A-63-81122, JP-A-1-138108, JP-A-2-175726, JP-A-5-238827, JP-A-5-238827, JP-A-6-122852, JP-A-6-306329, JP-A-6-299118, JP-A-9-31333, JP-A-5-345826, JP-A-4-63833, or the like may be used as the polysilazane-based compound.

Among these, a perhydropolysilazane in which all of Rx, Ry, and Rz are hydrogen atoms is preferable as the polysilazane-based compound from the viewpoint of availability and a capability to form an ion-implanted layer that exhibits an excellent gas barrier capability.

A product commercially available as a glass coating material or the like may be used directly as the polysilazane-based compound.

These polysilazane-based compounds may be used either alone or in combination.

The polymer layer may include an additional component other than the polymer compound as long as the object of the invention is not impaired. Examples of the additional component include a curing agent, an aging preventive, a light stabilizer, a flame retardant, and the like.

The content of the polymer compound in the polymer layer is preferably 50 mass % or more, and more preferably 70 mass % or more, since a barrier layer that exhibits an excellent gas barrier capability can be obtained.

The thickness of the polymer layer is not particularly limited, but is preferably 50 to 300 nm, and more preferably 50 to 200 nm.

A gas barrier laminate that exhibits a sufficient gas barrier capability can be obtained even when the polymer layer has a thickness at a nanometer level.

The polymer layer may be formed using an arbitrary method. For example, the polymer layer may be formed by preparing a polymer layer-forming solution that includes at least one polymer compound, an optional additional component, a solvent, and the like, applying the polymer layer-forming solution using a known method, and drying the resulting film. More specifically, the polymer layer may be formed in the same manner as the layer that includes the polysilazane-based compound (described later).

Examples of the modification treatment used for the polymer layer include an ion implantation treatment, a plasma treatment, a UV irradiation treatment, and the like.

Ions may be implanted into the polymer layer in the same manner as described later in connection with the layer that includes the polysilazane-based compound.

The water vapor transmission rate of the inorganic layer (inorganic layer and silicon oxynitride layer) at a temperature of 40° C. and a relative humidity of 90% is preferably 1 g/(m$^2$·day) or less, and more preferably 0.1 g/(m$^2$·day) or less.

When the silicon oxynitride layer is formed by subjecting a layer that includes the polysilazane-based compound to the modification treatment (e.g., plasma ion implantation treatment), the thickness of the composition-gradient region, as well as the content ratio of oxygen atoms, the content ratio of nitrogen atoms, and the content ratio of silicon atoms in the composition-gradient region can be appropriately controlled by setting the water vapor transmission rate of the inorganic layer within the above range.

When the silicon oxynitride layer is formed by subjecting a layer that includes the polysilazane-based compound (described later) to the plasma ion implantation treatment, the ratio of the thickness of the composition-gradient region to the thickness of the entire silicon oxynitride layer may decrease if the water vapor transmission rate of the inorganic layer exceeds 1 g/(m$^2$·day).

The water vapor transmission rate of the inorganic layer (inorganic layer and silicon oxynitride layer) may be measured using a known gas transmission rate measurement device.

Silicon Oxynitride Layer

The gas barrier unit includes at least two inorganic layers, and at least one of the at least two inorganic layers is a silicon oxynitride layer.

The silicon oxynitride layer is a layer that includes oxygen, nitrogen, and silicon as the main constituent atoms.

The silicon oxynitride layer included in the gas barrier unit makes it possible to obtain a gas barrier laminate that exhibits excellent interlayer adhesion, an excellent gas barrier capability, and excellent bendability.

The thickness of the silicon oxynitride layer is not particularly limited, but is preferably 50 to 300 nm, and more preferably 50 to 200 nm.

As illustrated in FIG. 1, a silicon oxynitride layer 4 includes a composition-gradient region (4a) in which the content ratio of oxygen decreases and the content ratio of nitrogen increases in the thickness direction toward the base. The thickness of the composition-gradient region (4a) is 25 nm or more. Note that reference sign 4b is the region of the silicon oxynitride layer 4 other than the composition-gradient region (4a).

It is preferable to increase the content ratio of nitrogen in order to improve the gas barrier capability of the silicon oxynitride layer. If the content ratio of nitrogen is too high, however, the bendability of the gas barrier laminate may deteriorate.

It is possible to obtain a gas barrier laminate that exhibits an excellent gas barrier capability and excellent bendability by forming the silicon oxynitride layer so as to include the composition-gradient region in which the content ratio of oxygen decreases and the content ratio of nitrogen increases in the thickness direction toward the base.

The ratio of the thickness of the composition-gradient region (4a) to the thickness of the entire silicon oxynitride layer is 0.15 or more, and preferably 0.2 or more. If the ratio of the thickness of the composition-gradient region to the thickness of the entire silicon oxynitride layer (thickness of composition-gradient region (4a)/(thickness of composition-gradient region (4a)+thickness of region (4b) other than composition-gradient region)) is less than 0.15, the performance of the gas barrier laminate may significantly deteriorate after bending in spite of the presence of the composition-gradient region (4a) since the region (4b) of the silicon oxynitride layer other than the composition-gradient region has a large thickness.

The upper limit of the ratio of the thickness of the composition-gradient region to the thickness of the entire silicon oxynitride layer is not particularly limited, but is normally 0.5 or less, and preferably 0.4 or less.

The thickness of the composition-gradient region may be estimated by subjecting the surface area of the silicon oxynitride layer to elemental analysis using X-ray photoelectron spectroscopy (XPS). Specifically, the thickness of the composition-gradient region may be estimated by calculating the thickness of the composition-gradient region from the sputtering time up to the region in which the content ratio of oxygen decreases and the content ratio of nitrogen increases in the thickness direction toward the base (determined by XPS). The depth of a layer is proportional to the sputtering time.

Note that the entire silicon oxynitride layer may be the composition-gradient region, or part of the silicon oxynitride layer may be the composition-gradient region. The composition-gradient region may be a region in which the content ratio of oxygen and the content ratio of nitrogen change continuously in the thickness direction, or may be a region in which the content ratio of oxygen and the content ratio of nitrogen change stepwise in the thickness direction.

The difference between the maximum value and the minimum value of the content rate of oxygen atoms with respect to the total content of oxygen atoms, nitrogen atoms, and silicon atoms in the composition-gradient region included in the silicon oxynitride layer is not particularly limited, but is preferably 10 to 60%, and more preferably 30 to 55%. The difference between the maximum value and the minimum value of the content rate of oxygen atoms can be calculated by the following expression. Note that Omax % is the maximum value of the content rate of oxygen atoms in the composition-gradient region, and Omin % is the minimum value of the content rate of oxygen atoms in the composition-gradient region.

Difference between maximum value and minimum value of content rate of oxygen atoms=
[Omax %]−[Omin %]

When the difference between the maximum value and the minimum value of the content rate of oxygen atoms in the composition-gradient region included in the silicon oxynitride layer is within the above range, it is possible to provide the gas barrier laminate with a further improved gas barrier capability and bendability.

The difference between the maximum value and the minimum value of the content rate of nitrogen atoms with respect to the total content of oxygen atoms, nitrogen atoms, and silicon atoms in the composition-gradient region included in the silicon oxynitride layer is not particularly limited, but is preferably 5 to 30%, and more preferably 15 to 30%. The difference between the maximum value and the minimum value of the content rate of nitrogen atoms can be calculated by the following expression. Note that Nmax % is the maximum value of the content rate of nitrogen atoms in the composition-gradient region, and Nmin % is the minimum value of the content rate of nitrogen atoms in the composition-gradient region.

Difference between maximum value and minimum value of content rate of nitrogen atoms= [Nmax %]−[Nmin %]

When the difference between the maximum value and the minimum value of the content rate of nitrogen atoms is within the above range, it is possible to provide the gas barrier laminate with a further improved gas barrier capability and bendability.

Note that the content ratio of oxygen atoms, the content ratio of nitrogen atoms, and the content ratio of silicon atoms in the composition-gradient region included in the silicon oxynitride layer are defined by a change in two or more atoms. A change in content ratio refers to the difference in content ratio due to a continuous change. The content rate of each atom refers to the stoichiometric ratio (number of atoms) of each atom with respect to the total content of silicon, oxygen, and nitrogen.

The content rate of oxygen atoms, the content rate of nitrogen atoms, and the content rate of silicon atoms in the composition-gradient region included in the silicon oxynitride layer may be determined by elemental analysis using X-ray photoelectron spectroscopy (XPS). Specifically, the content rate of oxygen atoms, the content rate of nitrogen atoms, and the content rate of silicon atoms in the composition-gradient region included in the silicon oxynitride layer may be determined using the measurement device and the measurement conditions described later in connection with the examples.

The content rate (%) of nitrogen atoms, the content rate (%) of oxygen atoms, and the content rate (%) of silicon atoms with respect to the total content of oxygen atoms, nitrogen atoms, and silicon atoms in the region (4b) of the silicon oxynitride layer other than the composition-gradient region are preferably 10 to 40%, 5 to 45%, and 40 to 60%, respectively. When the content rate of nitrogen atoms in the region (4b) other than the composition-gradient region is within the above range, it is possible to provide the gas barrier laminate with a further improved gas barrier capability and bendability.

The thickness of the composition-gradient region included in the silicon oxynitride layer is preferably 25 nm or more, and more preferably 35 nm or more. If the thickness of the composition-gradient region is less than 25 nm, a sufficient effect may not be achieved, and the performance of the gas barrier laminate after bending may deteriorate.

Examples of the silicon oxynitride layer having the above properties include an inorganic compound deposited film, a layer obtained by subjecting a layer that includes a polysilazane-based compound to a modification treatment, and the like. It is preferable that the silicon oxynitride layer be a layer obtained by subjecting a layer that includes a polysilazane-based compound to a modification treatment. A polysilazane-based compound reacts with water in air, and is converted into a polysiloxane-based compound through a polysiloxazane-based compound. When a layer that includes a polysilazane-based compound is formed on an inorganic layer, the polysilazane-based compound reacts with water in air to only a small extent. A silicon oxynitride layer that includes a composition-gradient region in which the content ratio of oxygen decreases and the content ratio of nitrogen increases in the thickness direction toward the base can be easily obtained by implanting ions into the layer that includes the polysilazane-based compound.

Examples of the polysilazane-based compound include those mentioned above in connection with the inorganic layer. A product commercially available as a glass coating material or the like may be used directly as the polysilazane-based compound.

These polysilazane-based compounds may be used either alone or in combination.

It is particularly preferable to use perhydropolysilazane from the viewpoint of gas barrier capability and availability.

The content of the polysilazane-based compound in the layer that includes the polysilazane-based compound is preferably 50 mass % or more, and more preferably 70 mass % or more, since a gas barrier layer that exhibits an excellent gas barrier capability can be obtained.

The layer that includes the polysilazane-based compound may be formed using an arbitrary method. For example, the layer that includes the polysilazane-based compound may be formed by preparing a polysilazane-based compound-containing layer-forming solution that includes at least one polysilazane-based compound, an optional additional component, a solvent, and the like, applying the polysilazane-based compound-containing layer-forming solution using a known method, and drying the resulting film.

Examples of the solvent used to prepare the polysilazane-based compound-containing layer-forming solution include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The polysilazane-based compound-containing layer-forming solution may be applied using a bar coating method, a spin coating method, a dipping method, a roll coating method, a gravure coating method, a knife coating method, an air-knife coating method, a roll knife coating method, a die coating method, a screen printing method, a spray coating method, a gravure offset method, or the like.

The film formed by applying the polysilazane-based compound-containing layer-forming solution may be dried using a known drying method such as hot-air drying, heat roll drying, or infrared irradiation. The heating temperature is normally 60 to 130° C. The heating time is normally several seconds to several tens of minutes.

When the silicon oxynitride layer is formed by subjecting a layer that includes the polysilazane-based compound to a plasma ion implantation treatment, the thickness of the composition-gradient region, as well as the content ratio of oxygen atoms, the content ratio of nitrogen atoms, and the content ratio of silicon atoms in the composition-gradient region can be appropriately controlled by appropriately selecting the underlayer material, and the drying temperature and the drying time when drying the film.

A change in the content rate of oxygen atoms, the content rate of nitrogen atoms, and the content rate of silicon atoms with respect to the total content of oxygen atoms, nitrogen atoms, and silicon atoms in the composition-gradient region included in the silicon oxynitride layer can normally be reduced as the drying time employed when drying the film formed using the polysilazane-based compound-containing layer-forming solution increases. This is because the polysilazane-based compound reacts with water in air, and is converted into a polysiloxane-based compound through a polysiloxazane-based compound.

Examples of the modification treatment include an ion implantation treatment, a plasma treatment, a UV irradiation treatment, a heat treatment, and the like.

The ion implantation treatment implants ions into the layer that includes the polysilazane-based compound to modify the layer that includes the polysilazane-based compound (described later).

The plasma treatment exposes the layer that includes the polysilazane-based compound to plasma to modify the layer that includes the polysilazane-based compound. The plasma treatment may be implemented using the method disclosed in JP-A-2012-106421, for example.

The UV irradiation treatment applies UV rays to the layer that includes the polysilazane-based compound to modify the layer that includes the polysilazane-based compound. The UV irradiation treatment may be implemented using the method disclosed in JP-A-2013-226757, for example.

It is preferable to use the ion implantation treatment since the inner area of the layer that includes the polysilazane-based compound can also be efficiently modified without roughening the surface of the layer that includes the polysilazane-based compound, and a gas barrier layer that exhibits an excellent gas barrier capability can be formed.

Examples of the ions that are implanted into the layer that includes the polysilazane-based compound include ions of a rare gas such as argon, helium, neon, krypton, and xenon; ions of fluorocarbon, hydrogen, nitrogen, oxygen, carbon dioxide, chlorine, fluorine, and sulfur; ions of an alkane-based gas such as methane and ethane; ions of an alkene-based gas such as ethylene and propylene; ions of an alkadiene-based gas such as pentadiene and butadiene; ions of an alkyne-based gas such as acetylene; ions of an aromatic hydrocarbon-based gas such as benzene and toluene; ions of a cycloalkane-based gas such as cyclopropane; ions of a cycloalkene-based gas such as cyclopentene; ions of a metal; ions of an organosilicon compound; and the like.

These ions may be used either alone or in combination.

It is preferable to use ions of a rare gas such as argon, helium, neon, krypton, or xenon due to the ease of ion implantation and a capability to form a silicon oxynitride layer that exhibits an excellent gas barrier capability.

The ion implantation dose may be appropriately determined taking account of the intended use of the gas barrier laminate (e.g., gas barrier capability and transparency), and the like.

Ions may be implanted by applying ions (ion beams) accelerated by applying an electric field, implanting ions present in plasma (plasma ion implantation method), or the like. It is preferable to use the plasma ion implantation method since the desired inorganic layer can be easily obtained.

The plasma ion implantation method may be implemented by generating plasma in an atmosphere containing a plasma-generating gas (e.g., rare gas), and implanting ions (cations) present in the plasma into the surface area of the polymer layer by applying a negative high-voltage pulse to the polymer layer, for example.

When the silicon oxynitride layer is formed by subjecting a layer that includes the polysilazane-based compound to a plasma ion implantation treatment, the thickness of the composition-gradient region, as well as the content ratio of oxygen atoms, the content ratio of nitrogen atoms, and the content ratio of silicon atoms in the composition-gradient region can be appropriately controlled by appropriately selecting the plasma ion implantation conditions (e.g., applied voltage) (see the examples).

The ratio of the thickness of the composition-gradient region to the thickness of the entire silicon oxynitride layer can normally be increased by increasing the applied voltage (negative applied voltage). It is also possible to increase a change in the content rate of oxygen atoms and the content rate of nitrogen atoms with respect to the total content of oxygen atoms, nitrogen atoms, and silicon atoms in the composition-gradient region included in the silicon oxynitride layer.

Gas Barrier Unit

The gas barrier unit included in the gas barrier laminate according to one embodiment of the invention may include two or more inorganic layers and/or two or more silicon oxynitride layers as long as the gas barrier unit includes at least two inorganic layers, and at least one of the at least two inorganic layers is a silicon oxynitride layer.

When the gas barrier unit includes two or more inorganic layers and/or two or more silicon oxynitride layers, the two or more inorganic layers and/or two or more silicon oxynitride layers may respectively have the same composition or a different composition.

The gas barrier unit may have any of the following layer configurations (i) to (v), for example. Note that the layer configuration of the gas barrier unit is not limited thereto.

(i) Inorganic layer/silicon oxynitride layer
(ii) Silicon oxynitride layer/inorganic layer
(iii) Inorganic layer/silicon oxynitride layer/silicon oxynitride layer
(iv) Inorganic layer/inorganic layer/silicon oxynitride layer
(v) Inorganic layer/silicon oxynitride layer/inorganic layer/silicon oxynitride layer Gas Barrier Laminate The gas barrier laminate according to one embodiment of the invention includes the base and the gas barrier unit. The gas barrier unit is stacked on the base either directly or through an additional layer.

One gas barrier unit may be stacked on the base, or two or more gas barrier units may be stacked on the base.

When two or more gas barrier units are stacked on the base, the two or more gas barrier units may have the same configuration or a different configuration.

Additional Layer

The gas barrier laminate according to one embodiment of the invention may further include an additional layer other than the base and the gas barrier unit (inorganic layer and silicon oxynitride layer).

Examples of the additional layer other than the base and the gas barrier unit include a primer layer that is used to improve interlayer adhesion between the base and the gas barrier unit (or interlayer adhesion between the gas barrier units), a conductive layer, an impact-absorbing layer, a pressure-sensitive adhesive layer, a casting sheet, and the like. The additional layer may be situated (stacked) at an arbitrarily position.

The gas barrier laminate according to one embodiment of the invention that includes the base and the gas barrier unit exhibits an excellent gas barrier capability, excellent bendability, and excellent interlayer adhesion. The gas barrier unit is preferably stacked on the base through the primer layer.

The layer configuration of the gas barrier laminate according to one embodiment of the invention is not particularly limited as long as the gas barrier laminate includes the base, the gas barrier unit that is stacked on the base and includes at least two inorganic layers, at least one of the at least two inorganic layers being a silicon oxynitride layer, and an optional additional layer unit that is stacked on the base. The gas barrier laminate according to one embodiment of the invention may have any of the following layer configurations (i) to (xiv), for example. Note that the layer configuration of the gas barrier laminate is not limited thereto.

(i) Base/inorganic layer/silicon oxynitride layer
(ii) Base/silicon oxynitride layer/inorganic layer
(iii) Base/primer layer/inorganic layer/silicon oxynitride layer
(iv) Base/primer layer/inorganic layer/silicon oxynitride layer/inorganic layer
(v) Base/primer layer/inorganic layer/silicon oxynitride layer/silicon oxynitride layer
(vi) Base/primer layer/silicon oxynitride layer/inorganic layer/inorganic layer/silicon oxynitride layer
(vii) Base/primer layer/inorganic layer/silicon oxynitride layer/silicon oxynitride layer
(viii) Base/primer layer/silicon oxynitride layer/inorganic layer/inorganic layer
(ix) Base/primer layer/silicon oxynitride layer/inorganic layer/silicon oxynitride layer
(x) Base/primer layer/inorganic layer/silicon oxynitride layer/inorganic layer/silicon oxynitride layer
(xi) Base/primer layer/inorganic layer/silicon oxynitride layer/pressure-sensitive adhesive layer/inorganic layer/silicon oxynitride layer
(xii) Base/primer layer/silicon oxynitride layer/inorganic layer/silicon oxynitride layer/inorganic layer
(xiii) Base/primer layer/silicon oxynitride layer/inorganic layer/pressure-sensitive adhesive layer/silicon oxynitride layer/inorganic layer
(xiv) Base/primer layer/silicon oxynitride layer/silicon oxynitride layer It is preferable that the silicon oxynitride layer be situated within the gas barrier unit at a position away from the base. It is preferable that the silicon oxynitride layer include the composition-gradient region (4a) at a position away from the base. When the composition-gradient region (4a) included in the gas barrier unit is formed at a position away from the base, it is possible to provide the gas barrier laminate with a further improved gas barrier capability and bendability.

Figure 2:
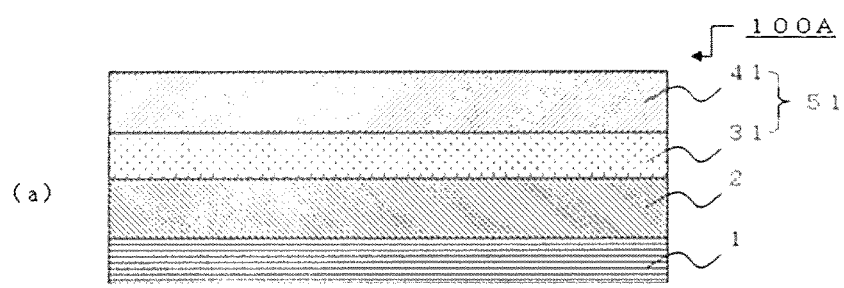
FIG. 2 is a cross-sectional view illustrating the layer configuration (structure) of a gas barrier laminate (examples and comparative examples).
Figure 2:
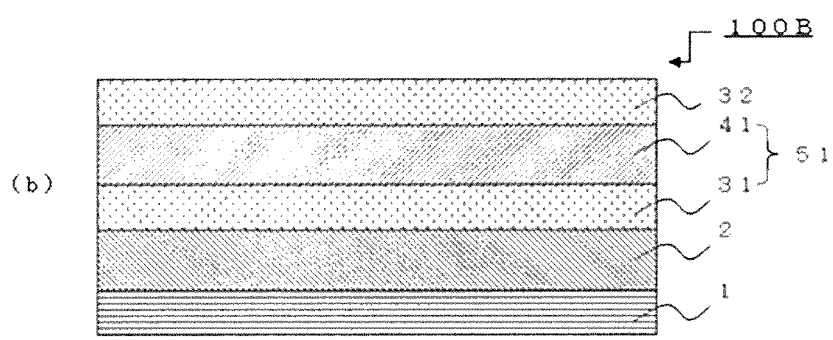
Figure 3:
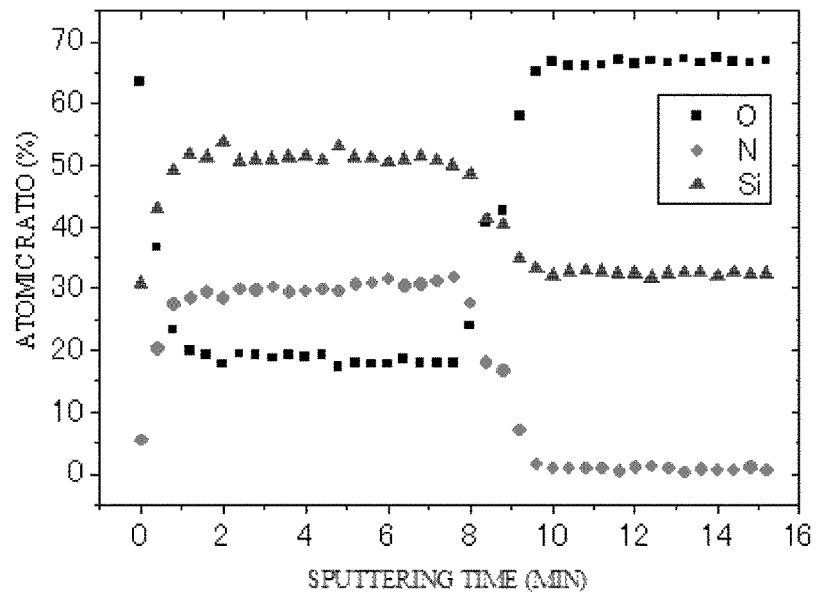
FIG. 3 is a view showing the content ratio (atomic ratio) (%) of oxygen atoms, the content ratio (atomic ratio) (%) of nitrogen atoms, and the content ratio (atomic ratio) (%) of silicon atoms in the laminate 1 in the depth direction.
Figure 4:
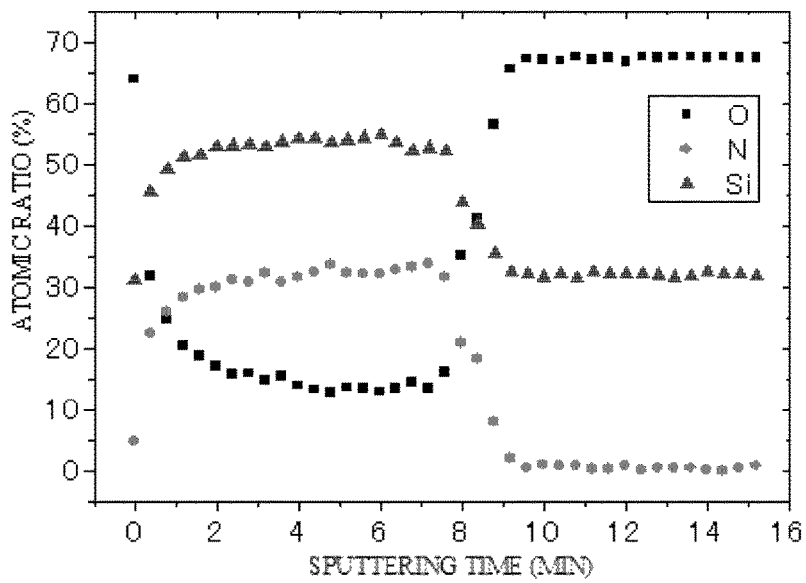
FIG. 4 is a view showing the content ratio (atomic ratio) (%) of oxygen atoms, the content ratio (atomic ratio) (%) of nitrogen atoms, and the content ratio (atomic ratio) (%) of silicon atoms in the laminate 2 in the depth direction.
Figure 5:
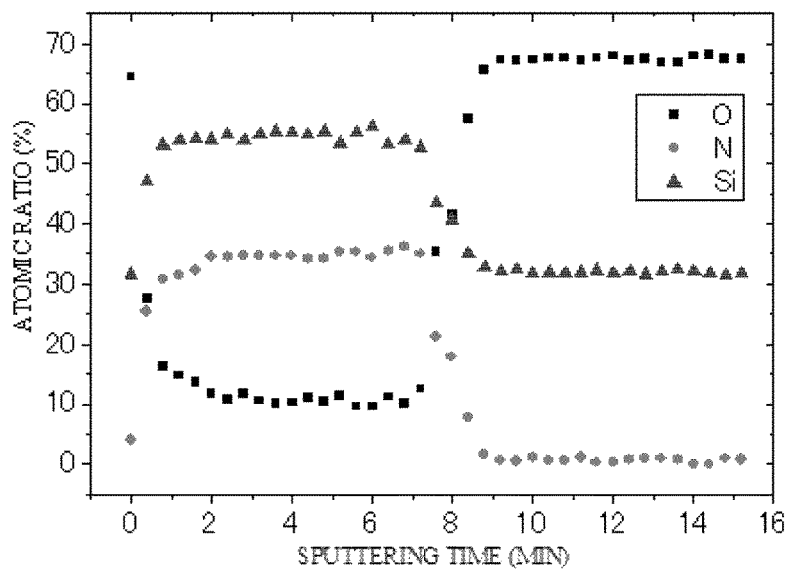
FIG. 5 is a view showing the content ratio (atomic ratio) (%) of oxygen atoms, the content ratio (atomic ratio) (%) of nitrogen atoms, and the content ratio (atomic ratio) (%) of silicon atoms in the laminate 3 in the depth direction.
Figure 6:
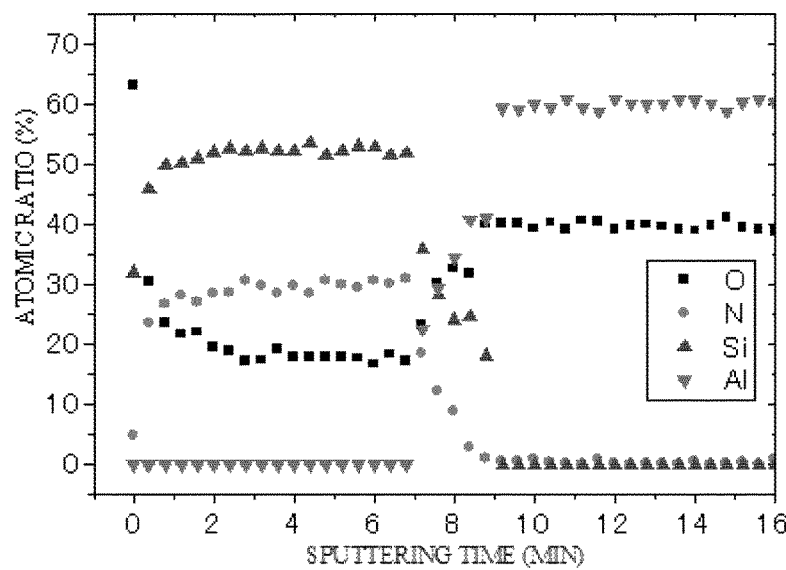
FIG. 6 is a view showing the content ratio (atomic ratio) (%) of oxygen atoms, the content ratio (atomic ratio) (%) of nitrogen atoms, and the content ratio (atomic ratio) (%) of silicon atoms in the laminate 4 in the depth direction.
Figure 7:
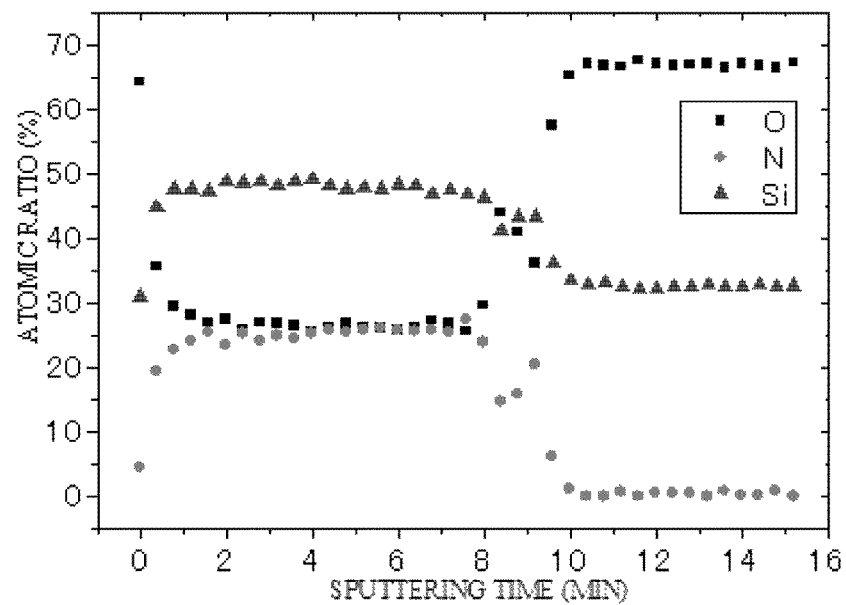
FIG. 7 is a view showing the content ratio (atomic ratio) (%) of oxygen atoms, the content ratio (atomic ratio) (%) of nitrogen atoms, and the content ratio (atomic ratio) (%) of silicon atoms in the laminate 5 in the depth direction.
Figure 8:
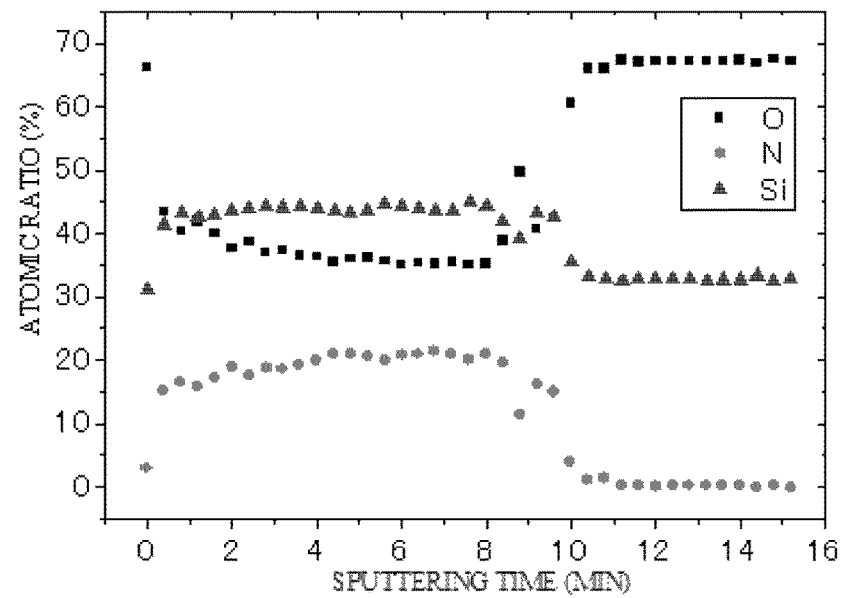
FIG. 8 is a view showing the content ratio (atomic ratio) (%) of oxygen atoms, the content ratio (atomic ratio) (%) of nitrogen atoms, and the content ratio (atomic ratio) (%) of silicon atoms in the laminate 6 in the depth direction.
Figure 9:
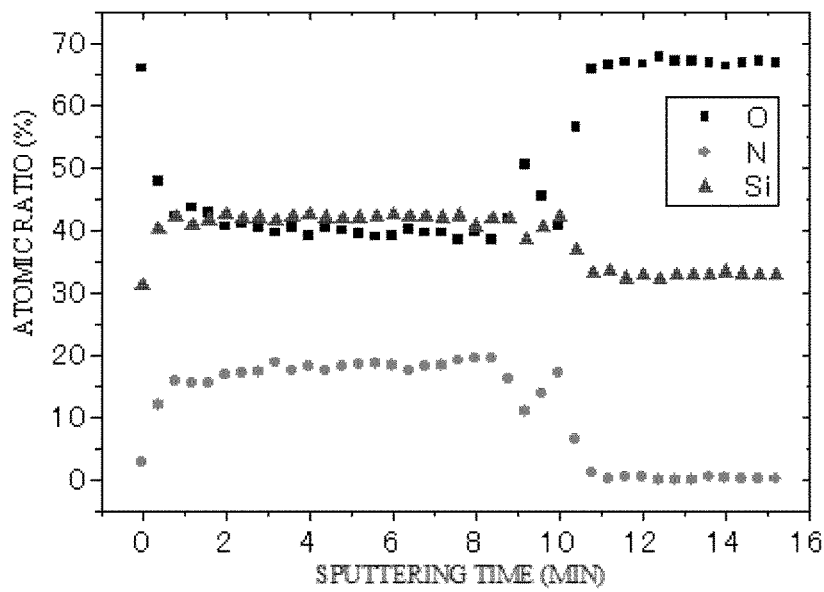
FIG. 9 is a view showing the content ratio (atomic ratio) (%) of oxygen atoms, the content ratio (atomic ratio) (%) of nitrogen atoms, and the content ratio (atomic ratio) (%) of silicon atoms in the laminate 7 in the depth direction.
Figure 10:
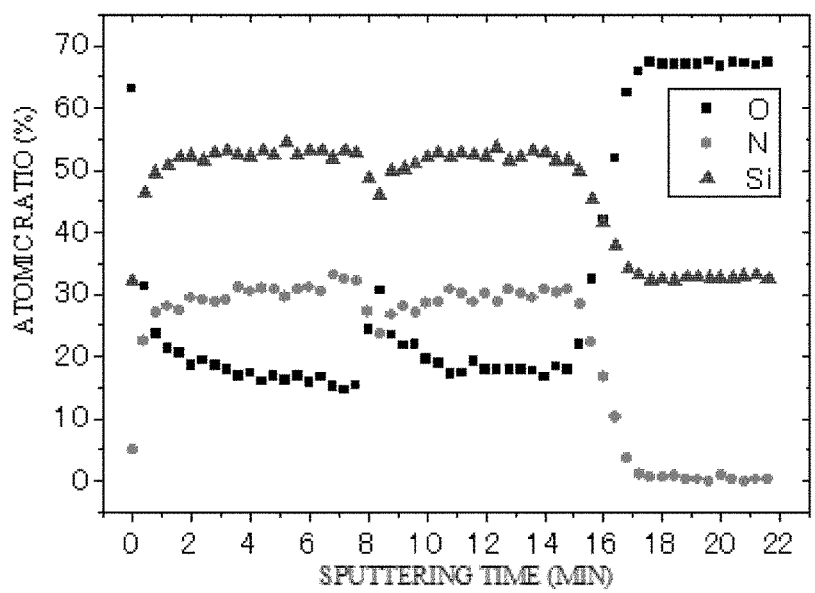
FIG. 10 is a view showing the content ratio (atomic ratio) (%) of oxygen atoms, the content ratio (atomic ratio) (%) of nitrogen atoms, and the content ratio (atomic ratio) (%) of silicon atoms in the laminate 8 in the depth direction.

FIG. 2 illustrates examples of the gas barrier laminate (see (a) and (b)).

A gas barrier laminate (100A) illustrated in FIG. 2 (see (a)) has a structure in which a base (1), a primer layer (2), and a gas barrier unit (51) that includes an inorganic layer (31) and a silicon oxynitride layer (41) are sequentially stacked. The silicon oxynitride layer (41) includes the composition-gradient region (4a) in which the content ratio of oxygen decreases and the content ratio of nitrogen increases in the thickness direction toward the base, and the ratio of the thickness of the composition-gradient region (4a) to the thickness of the entire silicon oxynitride layer is 0.15 or more.

In the gas barrier unit (51), the silicon oxynitride layer (41) includes the composition-gradient region (4a) at a position away from the base.

The gas barrier laminate (100A) is formed so that the gas barrier unit (51) that includes the inorganic layer (31) and the silicon oxynitride layer (41) meets the above requirements, and exhibits an excellent gas barrier capability and excellent bendability.

A gas barrier laminate (100B) illustrated in FIG. 2 (see (b)) has a structure in which a base (1), a primer layer (2), and a gas barrier unit (51) that includes a first inorganic layer (31), a silicon oxynitride layer (41), and a second inorganic layer (32) are sequentially stacked.

The silicon oxynitride layer (41) includes the composition-gradient region (4a) at a position away from the base.

Since the gas barrier laminate (100B) is formed so that the gas barrier unit (51) includes the first inorganic layer (31), the silicon oxynitride layer (41), and the second inorganic layer (32), the gas barrier laminate (100B) exhibits a further improved gas barrier capability and bendability.

The gas barrier laminate according to one embodiment of the invention may be produced using an arbitrary method.

For example, the gas barrier laminate (100A) may be produced by forming the primer layer (2) on the base (1) using the above method, forming the inorganic layer (31) on the primer layer (2) using the above method, and forming the silicon oxynitride layer (41) on the inorganic layer (31) using the above method.

The gas barrier laminate (100B) may be produced by forming the primer layer (2) on the base (1) using the above method, forming the inorganic layer (31) on the primer layer (2) using the above method, and forming the inorganic layer (32) on the silicon oxynitride layer (41) using the above method.

The gas barrier laminate according to one embodiment of the invention exhibits an excellent gas barrier capability and excellent bendability.

The gas barrier laminate according to one embodiment of the invention exhibits an excellent gas barrier capability since the gas barrier laminate according to one embodiment of the invention has a low water vapor transmission rate, for example. The water vapor transmission rate of the gas barrier laminate according to one embodiment of the invention at a temperature of 40° C. and a relative humidity of 90% is preferably $1 \times 10^{-2}$ g/(m²·day) or less, and more preferably $1 \times 10^{-3}$ g/(m²·day) or less.

The water vapor transmission rate of the gas barrier laminate may be measured using a known gas transmission rate measurement device.

The gas barrier laminate according to one embodiment of the invention exhibits excellent bendability. The gas barrier laminate according to one embodiment of the invention exhibits excellent bendability when subjected to the following test, for example. Specifically, each end of the gas barrier laminate is chucked while being supported by a round bar having a diameter of 8 mm to bend the gas barrier laminate at an angle of 145°. A weight (1.2 kg) is secured on one end of the gas barrier laminate, and a rotation mechanism is provided to the other end of the gas barrier laminate. The gas barrier laminate is repeatedly subjected to the bending test 1,000 times at 40 rpm. In this case, the water vapor transmission rate of the gas barrier laminate does not significantly increases. The water vapor transmission rate increase ratio (%) of the gas barrier laminate according to one embodiment of the invention due to the bending test is 20% or less, and preferably 15% or less. The bending test may be performed using a known folding endurance tester.

The gas barrier laminate according to one embodiment of the invention that exhibits the above properties may preferably be used as a member for an electronic device such as a liquid crystal display, an organic EL display, an inorganic EL display, electronic paper, and a solar cell.

3) Electronic Device Member and Electronic Device

An electronic device member according to one embodiment of the invention includes the gas barrier laminate according to one embodiment of the invention. Therefore, the electronic device member according to one embodiment of the invention exhibits an excellent gas barrier capability, and can prevent deterioration in an element (member or device) due to a gas (e.g., water vapor). Since the electronic device member exhibits excellent durability, the electronic device member may suitably be used as a display member for a liquid crystal display, an EL display, and the like; a solar cell back side protective sheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar cell, and the like.

Since the electronic device according to one embodiment of the invention includes the electronic device member that includes the gas barrier laminate according to one embodiment of the invention, the electronic device exhibits an excellent gas barrier capability and excellent durability.

EXAMPLES

The invention is further described below by way of examples. Note that the invention is not limited to the following examples.

The units "parts" and "%" used in connection with the examples respectively refer to "parts by mass" and "mass %" unless otherwise indicated.

In Table 1, the inorganic layer included in the gas barrier unit that is stacked at a position closest to the base is referred to as "first inorganic layer", the inorganic layer that is stacked at a position away from the base as compared with the first inorganic layer is referred to as "second inorganic layer", and the inorganic layer that is stacked at a position away from the base as compared with the second inorganic layer is referred to as "third inorganic layer".

Example 1

The primer layer-forming solution prepared as described below was applied to a PET film ("PET25T-100" manufactured by Mitsubishi Plastics, Inc., thickness: 25 μm) (base) using a bar coating method, and the resulting film was heated (dried) at 70° C. for 1 minute. UV rays were applied to the film (high-pressure mercury lamp, line speed: 20 m/min, cumulative intensity: 100 mJ/cm$^2$, peak intensity: 1.466 W, pass count: 2) using a UV-ray irradiation line to form a primer layer (thickness: 1 μm). A perhydropolysilazane-containing liquid ("AZNL110A-20" manufactured by AZ Electronic Materials) was spin-coated onto the primer layer, and the resulting film was heated at 120° C. for 2 minutes to form a perhydropolysilazane layer (thickness: 150 nm). Argon (Ar) ions were implanted into the perhydropolysilazane layer by performing a plasma ion implantation treatment under the following conditions to form a plasma ion-implanted perhydropolysilazane layer (hereinafter referred to as "inorganic layer A"). The water vapor transmission rate of the inorganic layer A was 0.02 g/(m$^2$·day).

A perhydropolysilazane-containing liquid ("AZNL110A-20" manufactured by AZ Electronic Materials) was spin-coated onto the inorganic layer A, and the resulting film was heated at 120° C. for 2 minutes to form a perhydropolysilazane layer (thickness: 150 nm). A silicon oxynitride layer (inorganic layer B) was formed on the inorganic layer A under the same conditions as those employed when forming the inorganic layer A, except that the perhydropolysilazane layer was subjected to the plasma ion implantation treatment at an applied voltage of −2 kV (instead of −6 kV) to obtain a gas barrier laminate 1 in which a gas barrier unit was provided on the base.

The silicon oxynitride layer (inorganic layer B) included a composition-gradient region (4a) that was situated at a position away from the base.

The plasma ion implantation treatment was performed using the following apparatus under the following conditions.

Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
Plasma Ion Implantation Conditions
Plasma-generating gas: Ar
Gas flow rate: 100 sccm
Duty ratio: 0.5%
Repetition frequency: 1,000 Hz
Applied voltage: −6 kV
RF power supply: frequency: 13.56 MHz, applied electric power: 1,000 W
Chamber internal pressure: 0.2 Pa
Pulse width: 5 sec
Treatment time (ion implantation time): 200 sec
Feed speed: 0.2 m/min
Preparation of Primer Layer-Forming Solution 20 parts of dipentaerythritol hexaacrylate ("A-DPH" manufactured by Shin-Nakamura Chemical Co., Ltd.) was dissolved in 100 parts of methyl isobutyl ketone. A photoinitiator ("Irgacure 127" manufactured by BASF) was added to the solution (in a ratio of 3% on a solid basis) to prepare a primer layer-forming solution.

Example 2

A gas barrier laminate 2 was obtained in the same manner as in Example 1, except that a silicon oxynitride layer (inorganic layer C) was formed instead of the inorganic layer B by changing the applied voltage from −2 kV to −4 kV. The silicon oxynitride layer (inorganic layer C) included a composition-gradient region at a position away from the base.

Example 3

A gas barrier laminate 3 was obtained in the same manner as in Example 1, except that a silicon oxynitride layer (inorganic layer D) was formed instead of the inorganic layer B by changing the applied voltage from −2 kV to −6 kV. The silicon oxynitride layer (inorganic layer D) included a composition-gradient region at a position away from the base.

Example 4

An aluminum oxide layer (thickness: 150 nm) (inorganic layer E) was formed instead of the inorganic layer A (see Example 1) by reactive sputtering using a reactive sputtering apparatus under the following conditions α. The water vapor transmission rate of the resulting inorganic layer E was 0.05 g/(m$^2$·day). A gas barrier laminate 4 was obtained in the same manner as in Example 1, except that a silicon oxynitride layer (inorganic layer F) was formed on the inorganic layer E instead of the inorganic layer B by changing the applied voltage from −2 kV to −6 kV. The silicon oxynitride layer (inorganic layer F) included a composition-gradient region at a position away from the base.

Reactive Sputtering Conditions α
Plasma-generating gas: argon and oxygen
Gas flow rate: argon: 100 sccm, oxygen: 60 sccm
Target material: aluminum
Electric power: 2,500 W
Vacuum chamber internal pressure: 0.2 Pa Example 5

A gas barrier laminate 5 was obtained in the same manner as in Example 3, except that a silicon oxynitride layer (inorganic layer G) was formed instead of the inorganic layer B by changing the drying time (at 120° C.) when forming the inorganic layer B from 2 minutes to 10 minutes, and changing the applied voltage from −2 kV to −6 kV. The silicon oxynitride layer (inorganic layer G) included a composition-gradient region at a position away from the base.

Example 6

A gas barrier laminate 6 was obtained in the same manner as in Example 1, except that a silicon oxynitride layer (inorganic layer H) was formed instead of the inorganic layer B by changing the drying time (at 120° C.) when forming the inorganic layer B from 2 minutes to 30 minutes. The silicon oxynitride layer (inorganic layer H) included a composition-gradient region at a position away from the base.

Example 7

A gas barrier laminate 7 was obtained in the same manner as in Example 1, except that a silicon oxynitride layer (inorganic layer I) was formed instead of the inorganic layer B by changing the drying time (at 120° C.) when forming the inorganic layer B from 2 minutes to 60 minutes. The silicon oxynitride layer (inorganic layer I) included a composition-gradient region at a position away from the base.

Example 8

A silicon oxynitride layer (inorganic layer J) was formed on the inorganic layer D of the gas barrier laminate 3 obtained in Example 3 under the same conditions as those employed when forming the inorganic layer D to obtain a gas barrier laminate 8. The silicon oxynitride layer (inorganic layer J) included a composition-gradient region at a position away from the base.

Comparative Example 1

A silicon oxide film (thickness: 150 nm) (inorganic layer K) was formed instead of the inorganic layer A (see Example 1) by reactive sputtering using a reactive sputtering apparatus under the following conditions β. The water vapor transmission rate of the resulting inorganic layer K was 0.08 g/(m²·day).

A silicon oxynitride layer (thickness: 150 nm) (inorganic layer L) was formed on the inorganic layer K instead of the inorganic layer B by reactive sputtering under the following conditions γ to obtain a gas barrier laminate 9.
Reactive Sputtering Conditions β
Plasma-generating gas: argon and oxygen
Gas flow rate: argon: 100 sccm, oxygen: 60 sccm
Target material: silicon
Electric power: 2,500 W
Vacuum chamber internal pressure: 0.2 Pa Reactive Sputtering Conditions γ
Plasma-generating gas: argon, nitrogen, and oxygen
Gas flow rate: argon: 100 sccm, nitrogen: 60 sccm, oxygen: 40 sccm
Target material: silicon
Electric power: 2,500 W
Vacuum chamber internal pressure: 0.2 Pa Comparative Example 2

A silicon oxynitride layer (thickness: 150 nm) (inorganic layer M) was formed instead of the inorganic layer L (see Comparative Example 1) by reactive sputtering under the following conditions δ to obtain a gas barrier laminate 10.
Reactive Sputtering Conditions δ
Plasma-generating gas: argon, nitrogen, and oxygen
Gas flow rate: A silicon oxynitride film (thickness: 130 nm) was formed at an argon flow rate of 100 sccm and a nitrogen flow rate of 60 sccm, and a silicon oxynitride film having a gradient composition was formed by increasing the oxygen flow rate by 6 sccm/sec while decreasing the nitrogen flow rate by 6 sccm/sec.
Target material: silicon
Electric power: 2,500 W
Vacuum chamber internal pressure: 0.2 Pa Comparative Example 3

A silicon oxide film (thickness: 300 nm) (inorganic layer P) was formed instead of the inorganic layer K (see Comparative Example 1) by reactive sputtering using a reactive sputtering apparatus under the conditions β without forming the inorganic layer L to obtain a gas barrier laminate 11.

Comparative Example 4

A gas barrier laminate 12 was obtained in the same manner as in Example 3, except that a silicon oxynitride layer (inorganic layer N) was formed instead of the inorganic layer D by changing the thickness of the perhydropolysilazane layer when forming the inorganic layer D from 150 nm to 250 nm.

Comparative Example 5

A gas barrier laminate 13 was obtained in the same manner as in Example 3, except that a silicon oxynitride layer (inorganic layer O) was formed instead of the inorganic layer D by changing the thickness of the perhydropolysilazane layer when forming the inorganic layer D from 150 nm to 350 nm.
XPS Elemental Analysis of Surface Layer Part of Silicon Oxynitride Layer XPS (X-ray photoelectron spectroscopy) elemental analysis was performed using the following measurement device under the following measurement conditions. The content rate of oxygen atoms, the content rate of carbon atoms, and the content rate of silicon atoms in the surface layer part of the silicon oxynitride layer included in the gas barrier laminate (gas barrier laminates obtained in Examples and Comparative Examples) were determined. Note that the thickness of the composition-gradient region included in the silicon oxynitride layer was calculated from the sputtering time up to the region in which the content ratio of oxygen decreases and the content ratio of nitrogen increases in the thickness direction toward the base.

Measurement device: "PHI Quantera SXM" manufactured by ULVAC-PHI, Incorporated
X-ray source: AlKα
X-ray beam diameter: 100 μm
Electric power: 25 W
Voltage: 15 kV
Take-off angle: 45°
Degree of vacuum: $5.0 \times 10^{-8}$ Pa
Sputtering conditions
Sputtering gas: argon
Applied voltage: −4 kV Table 1 shows the layer configuration of the gas barrier unit included in the gas barrier laminates 1 to 13, the presence or absence of the composition-gradient region in the silicon oxynitride layers B to D, F to J, L, M, N, and O, the thickness of the composition-gradient region, the ratio of the thickness of the composition-gradient region to the thickness of the silicon oxynitride layer (second inorganic layer), the difference between the maximum value and the minimum value of the content rate of oxygen atoms in the silicon oxynitride layer (second inorganic layer), and the difference between the maximum value and the minimum value of the content rate of nitrogen atoms in the silicon oxynitride layer (second inorganic layer). Each value measured for the silicon oxynitride layer (inorganic layer J) formed as the third inorganic layer (see the gas barrier laminate 8) is provided in parenthesis.

In Table 1, "A" refers to the inorganic layer A, "B" refers to the inorganic layer B, "C" refers to the inorganic layer C, "D" refers to the inorganic layer D, "E" refers to the inorganic layer E, "F" refers to the inorganic layer F, "G" refers to the inorganic layer G, "H" refers to the inorganic layer H, "K" refers to the inorganic layer K, "L" refers to the inorganic layer L, "M" refers to the inorganic layer M, "N" refers to the inorganic layer N, "O" refers to the inorganic layer O, and "P" refers to the inorganic layer P.

The gas barrier laminates 1 to 7 and 9 to 13 had the same layer configuration as that of the gas barrier laminate illustrated in FIG. 2 (see (a)), and the gas barrier laminate 8 had the same layer configuration as that of the gas barrier laminate illustrated in FIG. 2 (see (b)).

FIGS. 3 to 15 show the XPS elemental analysis results for the surface layer part of the silicon oxynitride layer included in the gas barrier laminates 1 to 13. In FIGS. 3 to 15, the horizontal axis indicates the sputtering time (min), and the vertical axis indicates the content ratio (atomic ratio) (%) of each atom.

The gas barrier laminates 1 to 8 obtained in Examples 1 to 8 included the base, and the gas barrier unit provided on the base and including the first inorganic layer and the silicon oxynitride layer, and the silicon oxynitride layer included a composition-gradient region in which the content ratio of oxygen decreases and the content ratio of nitrogen increases in the thickness direction toward the base (see FIGS. 3 to 10). The silicon oxynitride layer included the composition-gradient region at a position away from the base.

Figure 11:
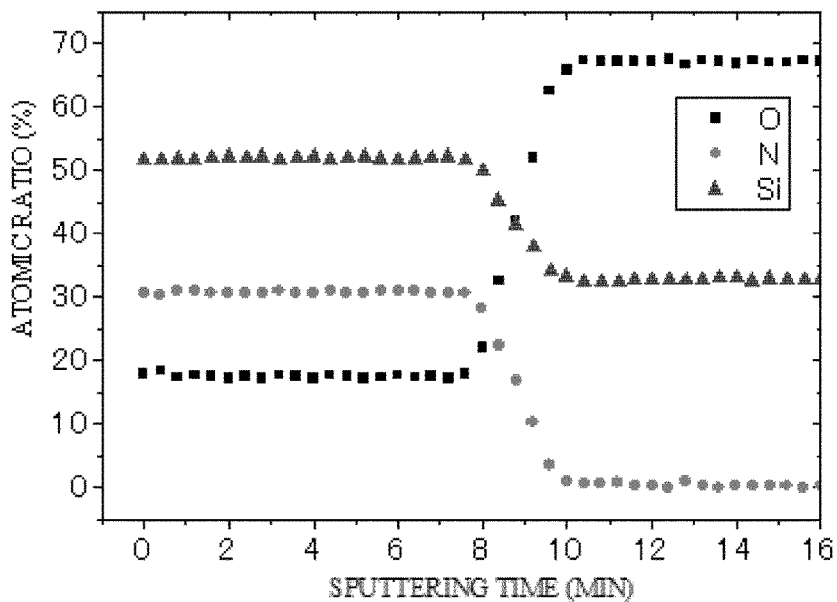
FIG. 11 is a view showing the content ratio (atomic ratio) (%) of oxygen atoms, the content ratio (atomic ratio) (%) of nitrogen atoms, and the content ratio (atomic ratio) (%) of silicon atoms in the laminate 9 in the depth direction.
Figure 12:
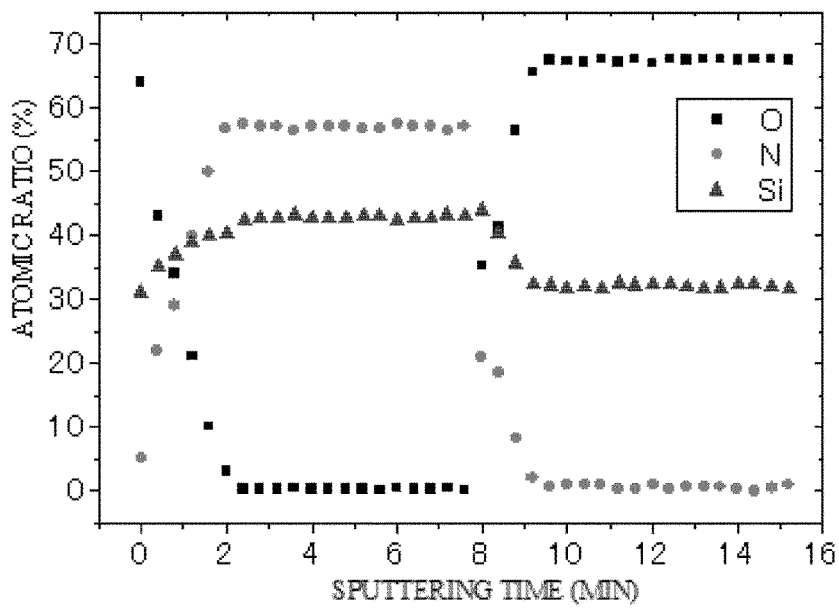
FIG. 12 is a view showing the content ratio (atomic ratio) (%) of oxygen atoms, the content ratio (atomic ratio) (%) of nitrogen atoms, and the content ratio (atomic ratio) (%) of silicon atoms in the laminate 10 in the depth direction.

The silicon oxynitride layer included in the gas barrier laminate 9 obtained in Comparative Example 1 did not include a composition-gradient region in which the content ratio of oxygen decreases and the content ratio of nitrogen increases in the thickness direction toward the base (see FIG. 11).

The silicon oxynitride layer included in the gas barrier laminates 10, 12, and 13 obtained in Comparative Examples 2, 4, and 5 included a composition-gradient region in which the content ratio of oxygen decreases and the content ratio of nitrogen increases in the thickness direction toward the base (see FIGS. 12, 14, and 15), but the ratio of the thickness of the composition-gradient region to the thickness of the entire silicon oxynitride layer was small.

Figure 13:
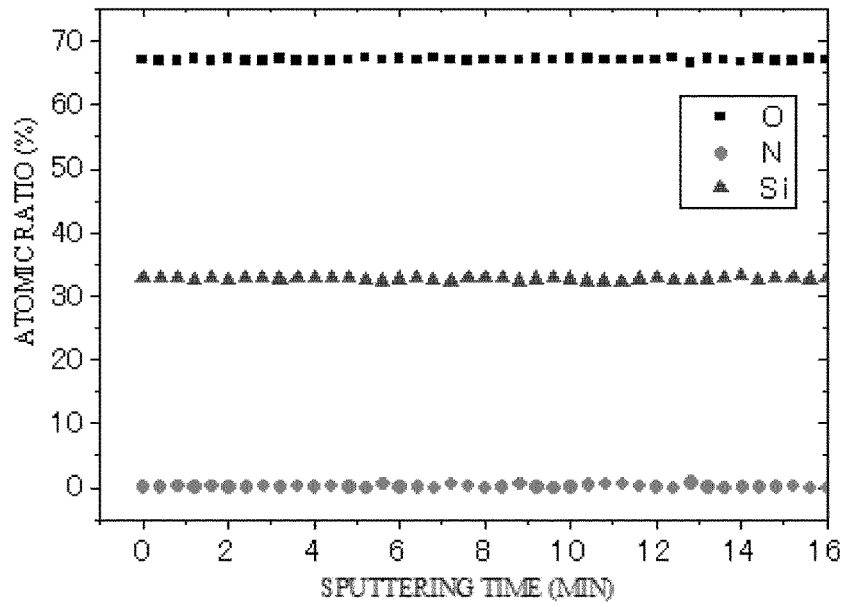
FIG. 13 is a view showing the content ratio (atomic ratio) (%) of oxygen atoms, the content ratio (atomic ratio) (%) of nitrogen atoms, and the content ratio (atomic ratio) (%) of silicon atoms in the laminate 11 in the depth direction.
Figure 14:
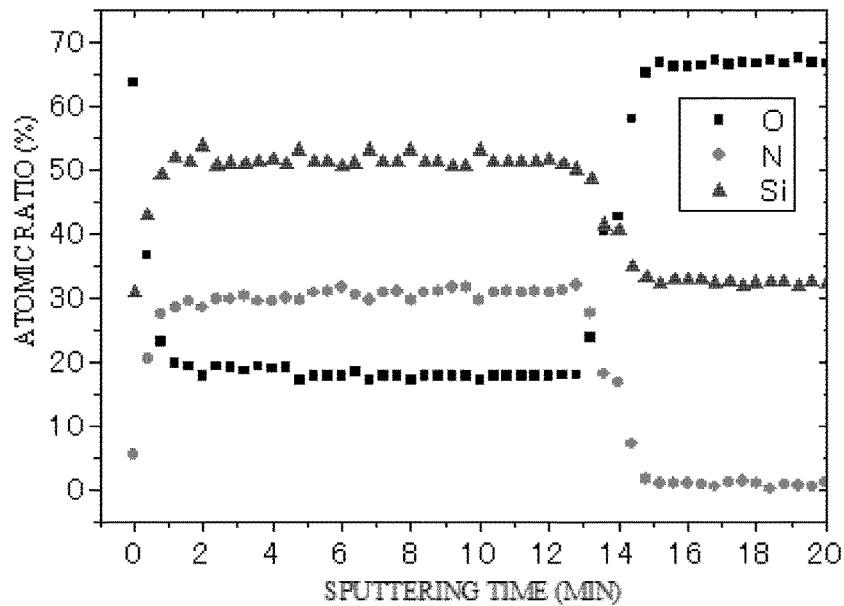
FIG. 14 is a view showing the content ratio (atomic ratio) (%) of oxygen atoms, the content ratio (atomic ratio) (%) of nitrogen atoms, and the content ratio (atomic ratio) (%) of silicon atoms in the laminate 12 in the depth direction.
Figure 15:
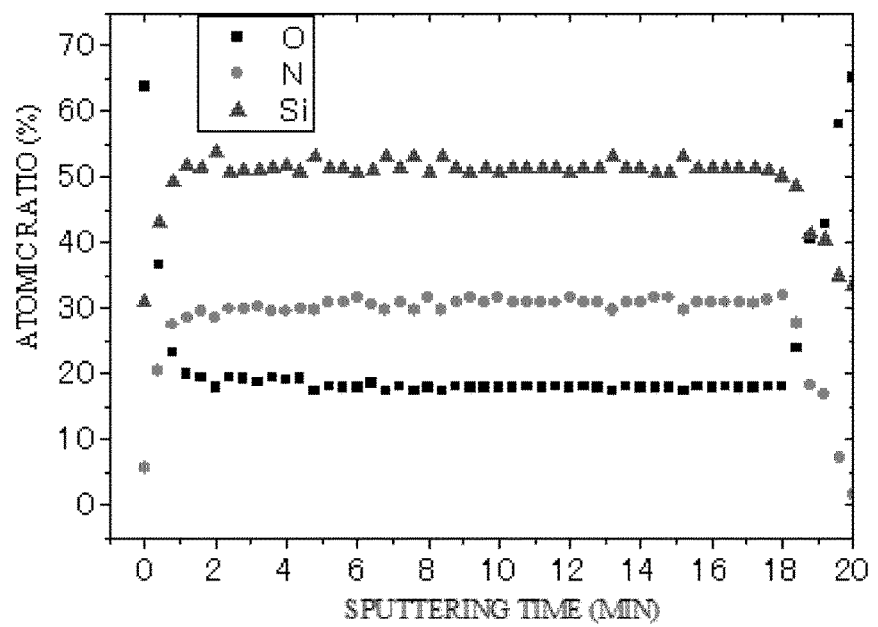
FIG. 15 is a view showing the content ratio (atomic ratio) (%) of oxygen atoms, the content ratio (atomic ratio) (%) of nitrogen atoms, and the content ratio (atomic ratio) (%) of silicon atoms in the laminate 13 in the depth direction.

The gas barrier laminate 11 obtained in Comparative Example 3 did not include a silicon oxynitride layer (see FIG. 13).

TABLE 1

| | | Layer configuration of gas barrier unit | | | |
|---|---|---|---|---|---|
| | Gas barrier laminate | First inorganic layer | Second inorganic layer | Third inorganic layer | Presence or absence of composition-gradient region |
| Example 1 | 1 | A | B | — | Provided |
| Example 2 | 2 | A | C | — | Provided |
| Example 3 | 3 | A | D | — | Provided |
| Example 4 | 4 | E | F | — | Provided |
| Example 5 | 5 | A | G | — | Provided |
| Example 6 | 6 | A | H | — | Provided |
| Example 7 | 7 | A | I | — | Provided |
| Example 8 | 8 | A | D | J | Provided |
| Comparative Example 1 | 9 | K | L | — | Not provided |
| Comparative Example 2 | 10 | K | M | — | Provided |
| Comparative Example 3 | 11 | P | — | — | — |
| Comparative Example 4 | 12 | A | N | — | Provided |
| Comparative Example 5 | 13 | A | O | — | Provided |

| | Thickness of composition-gradient region (nm) | Ratio of thickness of composition-gradient region to thickness of entire silicon oxynitride layer | Difference between maximum value and minimum value of content rate of oxygen atoms | Difference between maximum value and minimum value of content rate of nitrogen atoms |
|---|---|---|---|---|
| Example 1 | 34.1 | 0.22 | 50 | 25 |
| Example 2 | 35.7 | 0.24 | 50 | 25 |

TABLE 1-continued

| | | | | |
|---|---|---|---|---|
| Example 3 | 45 | 0.3 | 55 | 30 |
| Example 4 | 45 | 0.3 | 55 | 30 |
| Example 5 | 35.7 | 0.24 | 37 | 20 |
| Example 6 | 39.1 | 0.26 | 32 | 17 |
| Example 7 | 26.1 | 0.17 | 26 | 16 |
| Example 8 | 37.5 (45) | 0.25 (0.3) | 55 (15) | 30 (5) |
| Comparative Example 1 | 0 | 0 | 0 | 0 |
| Comparative Example 2 | 20 | 0.13 | 65 | 50 |
| Comparative Example 3 | — | — | — | — |
| Comparative Example 4 | 34.1 | 0.14 | 55 | 30 |
| Comparative Example 5 | 34.1 | 0.1 | 55 | 30 |

Each value in parenthesis was measured for the third inorganic layer.

Evaluation of Water Vapor Barrier Performance

Calcium metal was deposited on the surface of the outermost inorganic layer of the gas barrier laminate (gas barrier laminates 1 to 13) using a vacuum deposition device ("E-200" manufactured by ALS). The side of the gas barrier laminate on which calcium metal was deposited was bonded to quartz glass (thickness: 0.20 mm) through a UV-curable sealing resin (manufactured by Nagase ChemteX Corporation) in a dry nitrogen gas atmosphere, and UV rays were applied to the resulting laminate to prepare an evaluation cell. The evaluation cell was stored at a high temperature (40° C.) and a high humidity (90% RH), and the amount of water that entered the cell was calculated from the corrosion mass of calcium metal using the method described in JP-A-2005-283561.

A case where the water vapor transmission rate was $1 \times 10^{-3}$ g/(m²·day) or less was evaluated as "Good", and a case where the water vapor transmission rate was more than $1 \times 10^{-3}$ g/(m²·day) was evaluated as "Bad".

Measurement of Water Vapor Transmission Rate of Inorganic Layer

The water vapor transmission rate of the laminate (Examples and Comparative Examples) (in a state in which the second inorganic layer was not stacked) (water vapor transmission rate measurement sample) at a temperature of 40° C. and a relative humidity of 90% was measured using a water vapor transmission rate measurement device ("PERMATRN" manufactured by MOCON). The measured value was taken as the water vapor transmission rate of the first inorganic layer.

Bending Test

A bending test was performed using a folding endurance tester ("IMC-1594" manufactured by Imoto Machinery Co., Ltd.). Specifically, each end of the gas barrier laminate was chucked while being supported by a round bar having a diameter of 8 mm to bend the gas barrier laminate at an angle of 145°. A weight (1.2 kg) was secured on one end of the gas barrier laminate, and a rotation mechanism was provided to the other end of the gas barrier laminate. The gas barrier laminate was repeatedly subjected to the bending test 1,000 times at 40 rpm.

A case where the water vapor transmission rate increase ratio (%) due to the bending test was 100 or less was evaluated as "Good", and a case where the water vapor transmission rate increase ratio (%) due to the bending test was more than 100 was evaluated as "Bad".

The test results and the measurement results are shown in Table 2.

TABLE 2

| | | Water vapor transmission rate (g/(m²·day)) | | | | |
|---|---|---|---|---|---|---|
| | Gas barrier laminate | Before bending test | After bending test | Increase ratio (%) due to bending test | Water vapor barrier capability | Bendability |
| Example 1 | 1 | $7.0 \times 10^{-4}$ | $8.0 \times 10^{-4}$ | 14.3 | Good | Good |
| Example 2 | 2 | $7.5 \times 10^{-4}$ | $9.0 \times 10^{-4}$ | 20 | Good | Good |
| Example 3 | 3 | $7.5 \times 10^{-4}$ | $8.3 \times 10^{-4}$ | 10 | Good | Good |
| Example 4 | 4 | $7.3 \times 10^{-4}$ | $8.1 \times 10^{-4}$ | 11 | Good | Good |
| Example 5 | 5 | $8.0 \times 10^{-4}$ | $8.6 \times 10^{-4}$ | 7.50 | Good | Good |
| Example 6 | 6 | $8.5 \times 10^{-4}$ | $9.2 \times 10^{-4}$ | 8.24 | Good | Good |
| Example 7 | 7 | $9.0 \times 10^{-4}$ | $9.9 \times 10^{-4}$ | 10 | Good | Good |
| Example 8 | 8 | $5.0 \times 10^{-4}$ | $7.0 \times 10^{-4}$ | 40 | Good | Good |
| Comparative Example 1 | 9 | $6.2 \times 10^{-4}$ | $2.0 \times 10^{-3}$ | 233 | Good | Bad |
| Comparative Example 2 | 10 | $5.0 \times 10^{-4}$ | $1.25 \times 10^{-3}$ | 150 | Good | Bad |
| Comparative Example 3 | 11 | $4.0 \times 10^{-3}$ | $4.4 \times 10^{-3}$ | 10 | Bad | Good |
| Comparative Example 4 | 12 | $4.0 \times 10^{-4}$ | $2.5 \times 10^{-3}$ | 525 | Good | Bad |
| Comparative Example 5 | 13 | $3.0 \times 10^{-4}$ | $2.5 \times 10^{-3}$ | 733 | Good | Bad |

As shown in Table 2, the gas barrier laminates obtained in Examples (inventive gas barrier laminates) exhibited an excellent water vapor barrier capability and excellent bendability (i.e., an increase in water vapor transmission rate due to the bending test was small).

The gas barrier laminate obtained in Comparative Example 1 in which a silicon oxynitride layer including a composition-gradient region was not provided, the gas barrier laminate obtained in Comparative Example 2 in which a silicon oxynitride layer including a composition-gradient region was provided, but the thickness of the composition-gradient region was too small, and the gas barrier laminates obtained in Comparative Examples 4 and 5 in which a silicon oxynitride layer including a composition-gradient region was provided, but the ratio of the thickness of the composition-gradient region to the thickness of the entire silicon oxynitride layer was less than 0.15, exhibited an excellent initial water vapor barrier capability, but exhibited poor bendability (i.e., the water vapor transmission rate significantly increased due to the bending test).

The gas barrier laminate obtained in Comparative Example 3 in which a silicon oxynitride layer was not provided, exhibited excellent bendability, but exhibited a poor initial water vapor barrier capability.

REFERENCE SIGNS LIST

1: Base
2: Primer layer
31, 32: Inorganic layer
4a: Composition-gradient region
4b: Region of silicon oxynitride layer other than composition-gradient region
4, 41, 42: Silicon oxynitride layer
51, 52: Gas barrier unit
100A, 100B: Gas barrier laminate

The invention claimed is:

1. A gas barrier laminate comprising a base and a gas barrier unit, wherein:
    the gas barrier unit comprises at least two inorganic layers, the at least two inorganic layers comprising one or more silicon oxynitride layers and at least one inorganic deposited film,
    a layer configuration of the gas barrier laminate is one of:
        base/inorganic layer/silicon oxynitride layer,
        base/primer layer/inorganic layer/silicon oxynitride layer,
        base/primer layer/inorganic layer/silicon oxynitride layer/silicon oxynitride layer,
        base/primer layer/silicon oxynitride layer/inorganic layer/inorganic layer/silicon oxynitride layer,
        base/primer layer/inorganic layer/silicon oxynitride layer/silicon oxynitride layer,
        base/primer layer/silicon oxynitride layer/inorganic layer/silicon oxynitride layer,
        base/primer layer/inorganic layer/silicon oxynitride layer/inorganic layer/silicon oxynitride layer, or
        base/primer layer/inorganic layer/silicon oxynitride layer/pressure-sensitive adhesive layer/inorganic layer/silicon oxynitride layer,
    an outermost silicon oxynitride layer includes a composition-gradient region and a region other than the composition-gradient region, the composition-gradient region having a thickness of 25 nm or more, and being a region in which a content ratio of oxygen decreases and a content ratio of nitrogen increases in a thickness direction toward the base,
    a ratio of the thickness of the composition-gradient region to a thickness of the entire outermost silicon oxynitride layer is 0.15 or more,
    a difference between a maximum value and a minimum value of a content rate of oxygen atoms with respect to a total content of oxygen atoms, nitrogen atoms, and silicon atoms in the composition-gradient region included in the outermost silicon oxynitride layer is 10 to 60%,
    a difference between a maximum value and a minimum value of a content rate of nitrogen atoms with respect to the total content of oxygen atoms, nitrogen atoms, and silicon atoms in the composition-gradient region included in the outermost silicon oxynitride layer is 5 to 30%,
    the outermost silicon oxynitride layer is a layer formed by subjecting a layer that includes a polysilazane-based compound to a modification treatment,
    the at least one inorganic deposited film is formed using only one kind of raw material selected from silicon oxide, aluminum oxide, magnesium oxide, silicon nitride, aluminum nitride, titanium nitride, aluminum, magnesium, and zinc, and
    wherein the composition gradient region of the outermost silicon oxynitride layer among the one or more silicon oxynitride layers in the gas barrier unit is an outermost layer of the gas barrier laminate.

2. The gas barrier laminate according to claim 1, wherein the difference between the maximum value and the minimum value of the content rate of nitrogen atoms with respect to the total content of oxygen atoms, nitrogen atoms, and silicon atoms in the composition-gradient region included in the outermost silicon oxynitride layer is 5 to 20%.

3. The gas barrier laminate according to claim 1, wherein the outermost silicon oxynitride layer is formed by subjecting the layer that includes the polysilazane-based compound to an ion implantation treatment.

4. The gas barrier laminate according to claim 3, wherein the ion implantation treatment implants ions of at least one gas selected from a group consisting of hydrogen, nitrogen, oxygen, argon, helium, neon, xenon, and krypton using a plasma ion implantation method.

5. The gas barrier laminate according to claim 1, wherein the gas barrier unit has a layer configuration (i): inorganic layer/silicon oxynitride layer, a layer configuration (iii): inorganic layer/silicon oxynitride layer/silicon oxynitride layer, or a layer configuration (v): inorganic layer/silicon oxynitride layer/inorganic layer/silicon oxynitride layer.

6. The gas barrier laminate according to claim 1, wherein the outermost silicon oxynitride layer is situated within the gas barrier unit at a position away from the base.

7. The gas barrier laminate according to claim 1, wherein the outermost silicon oxynitride layer includes the composition-gradient region at a position away from the base.

8. The gas barrier laminate according to claim 1, wherein a thickness of the at least one inorganic deposited film is 5 nm or more and 500 nm or less.

9. The gas barrier laminate according to claim 1, wherein the ratio of the thickness of the composition-gradient region to the thickness of the entire outermost silicon oxynitride layer is 0.4 or less.

10. The gas barrier laminate according to claim 1, wherein a thickness of the base is 0.5 to 500 μm.

11. The gas barrier laminate according to claim 1, wherein a material for forming the base is a resin selected from the group consisting of a polyimide, a polyamide, a polyamideimide, a polyphenylene ether, a polyether ketone, a polyether ether ketone, a polyolefin, a polyester, a polycarbonate, a polysulfone, a polyether sulfone, a polyphenylene sulfide, an acrylic-based resin, a cycloolefin-based polymer, and an aromatic polymer.

12. The gas barrier laminate according to claim 1, wherein a thickness of the outermost silicon oxynitride layer is 50 to 300 nm.

13. An electronic device member comprising the gas barrier laminate according to claim 1.

14. An electronic device comprising the electronic device member according to claim 13.

* * * * *